United States Patent
Koliwad et al.

(10) Patent No.: US 12,149,084 B2
(45) Date of Patent: Nov. 19, 2024

(54) SENSORS FOR USE IN HVDC POWER TRANSMISSION NETWORKS

(71) Applicant: General Electric Technology GmbH, Baden (CH)

(72) Inventors: Ajay Koliwad, Oreland, PA (US); Li Zou, Stafford (GB); Markus Andre Offergeld, Constance (DE); Madhusudan Nandula, Stafford (GB)

(73) Assignee: GE INFRASTRUCTURE TECHNOLOGY LLC, Greenville, SC (US)

( * ) Notice: Subject to any disclaimer, the term of this patent is extended or adjusted under 35 U.S.C. 154(b) by 201 days.

(21) Appl. No.: 17/888,078

(22) Filed: Aug. 15, 2022

(65) Prior Publication Data
US 2024/0055864 A1  Feb. 15, 2024

(51) Int. Cl.
*H02J 3/36* (2006.01)
*G01R 31/08* (2020.01)
*H02H 7/26* (2006.01)

(52) U.S. Cl.
CPC .............. *H02J 3/36* (2013.01); *G01R 31/085* (2013.01); *H02H 7/268* (2013.01)

(58) Field of Classification Search
CPC .... H02J 3/36; H02J 2003/365; G01R 31/085; G01R 31/08; H02H 7/268; H02H 7/26
See application file for complete search history.

(56) References Cited

U.S. PATENT DOCUMENTS

| | | | |
|---|---|---|---|
| 9,447,778 B2 | 9/2016 | Caponetti et al. | |
| 10,179,512 B2 * | 1/2019 | Matsuda | B60L 58/26 |
| 11,632,060 B2 * | 4/2023 | Hario | H02M 7/4835 |
| | | | 363/65 |
| 2020/0124692 A1 * | 4/2020 | Ueno | G01R 31/2829 |
| 2023/0187922 A1 * | 6/2023 | Randazzo | H03K 19/20 |
| | | | 361/87 |

OTHER PUBLICATIONS

Geetha et al.: A comprehensive review on energy management strategies of hybrid energy storage system for electric vehicles. International Journal of Energy Research, vol. 41, No. 13, pp. 1817, 2017.

* cited by examiner

*Primary Examiner* — Adolf D Berhane
(74) *Attorney, Agent, or Firm* — Eversheds Sutherland (US) LLP

(57) ABSTRACT

In the field of high voltage direct current (HVDC) power transmission networks there is a need for an improved sensor failure detector. A sensor failure detector, for use in HVDC power transmission networks, includes an intelligent electronic device. The intelligent electronic device has a first input to receive in-use a number of first sample values from a first sensor measuring a given operational characteristic, and a second input to receive in-use a number of second sample values from a second sensor measuring the same given operational characteristic. The intelligent electronic device also includes a comparator module that is programmed to compare the first and second sample values with one another, and to establish a sensor failure when the first and second sample values differ from one another by more than a primary threshold for a predetermined first number of samples.

20 Claims, 1 Drawing Sheet

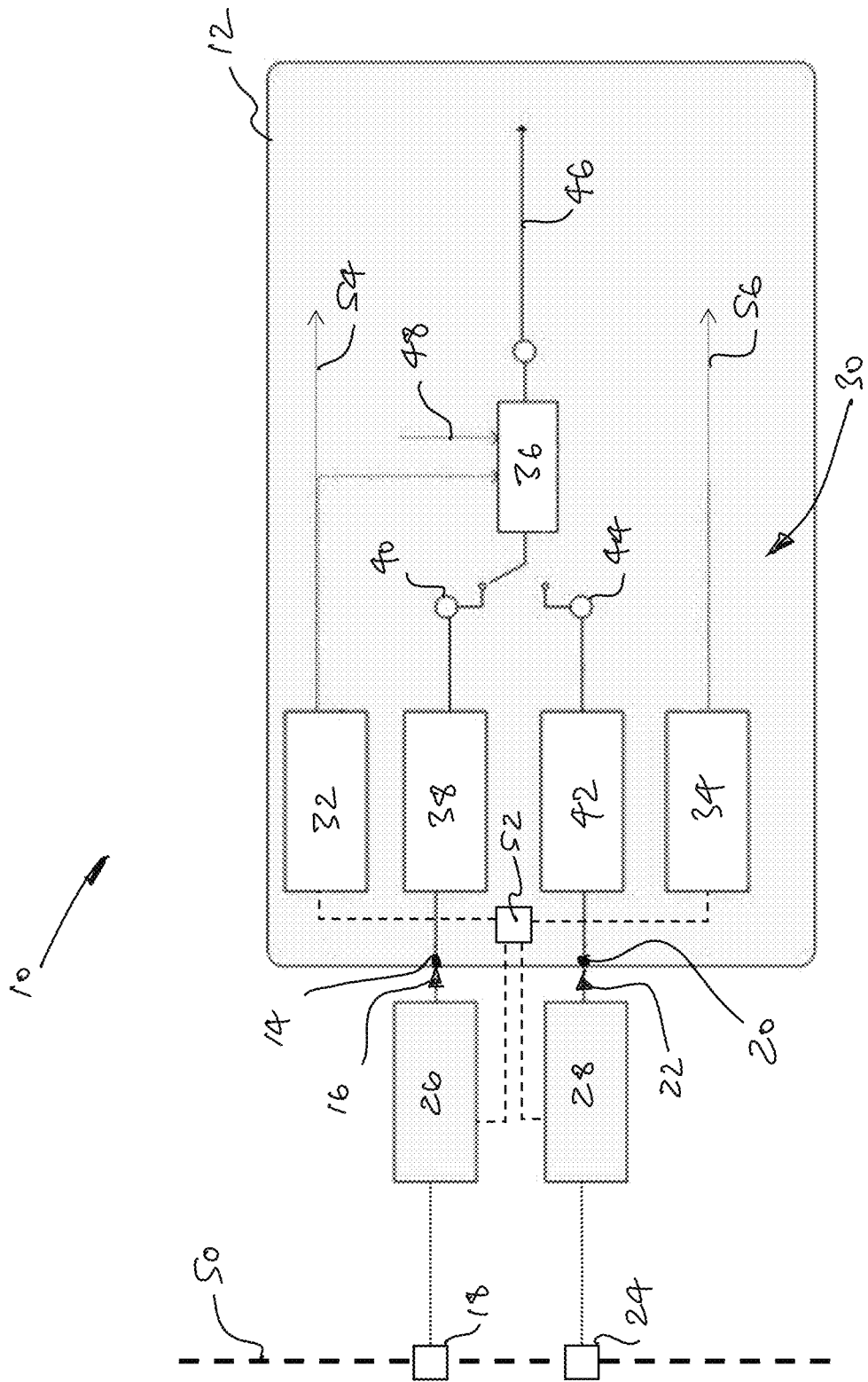

SENSORS FOR USE IN HVDC POWER TRANSMISSION NETWORKS

TECHNICAL FIELD

This invention relates to a sensor failure detector for use in a high voltage direct current (HVDC) power transmission network, a sensor assembly comprising such a sensor failure detector, and a method of establishing a sensor failure within a HVDC power transmission network.

BACKGROUND OF THE INVENTION

In HVDC power transmission networks AC power is typically converted to DC power for transmission via overhead lines, under-sea cables and/or underground cables. This conversion removes the need to compensate for the AC capacitive load effects imposed by the power transmission medium, i.e. the transmission line or cable, and reduces the cost per kilometre of the lines and/or cables, and thus becomes cost-effective when power needs to be transmitted over a long distance. DC power may also be transmitted directly from offshore wind parks to onshore AC power transmission networks.

The conversion between DC power and AC power is utilised where it is necessary to interconnect DC and AC networks. In any such power transmission network, converters (i.e. power converters) are required at each interface between AC and DC power to affect the required conversion from AC to DC or from DC to AC.

SUMMARY OF THE INVENTION

According to a first aspect of the invention there is provided a sensor failure detector, for use in HVDC power transmission networks, comprising an intelligent electronic device having:
- a first input to receive in-use a plurality of first sample values from a first sensor measuring a given operational characteristic;
- a second input to receive in-use a plurality of second sample values from a second sensor measuring the same given operational characteristic; and
- a comparator module programmed to compare the first and second sample values with one another and to establish a sensor failure when the first and second sample values differ from one another by more than a primary threshold for a predetermined first number of samples.

Establishing a sensor failure, i.e. establishing that one or other of the first and second sensors is faulty or is unable for whatever reason to provide a sample measurement value, simply when the first and second samples differ from one another by a predetermined amount for more than a given number of samples is easy to both implement and to configure. Hence it provides for reliable detection of a sensor failure.

This is in contrast to conventional ways of detecting a sensor failure which typically rely on recognising measurement discrepancies during a fault in the power transmission network such as a short-circuit to identify the failed measurement sensor. This is a complex, and sometime impossible task. In such instances an undetected sensor failure may cause incorrect operation of associated network protection equipment and/or render—the HVDC power transmission network unavailable.

Preferably the comparator module is additionally programmed, when it has established a sensor failure, to identify the sensor remaining operational as being the first or second sensor with sample values that are furthest from zero.

The ability to identify a specific sensor, i.e. the first or second sensor, that remains operational is advantageous because it permits the repair, servicing or replacement of the other, failed sensor, so as to restore the full functionality of the sensor failure detector.

In a preferred embodiment of the invention the comparator module is further programmed, when it has established a sensor failure, to output to downstream processes qualified measurement values corresponding to the first or second sample values from the sensor remaining operational.

Having a comparator module that is further programmed in the aforementioned manner provides for a sensor failure detector that is able to take action on the fly, i.e. without any interruption, by continuing to provide accurate and reliable sensor measurement values to downstream processes, such as control and/or protection equipment, in the event of one or other of first and second sensors failing, and thus improves the availability and stability of the HVDC power transmission network.

The comparator module may be additionally programmed when comparing the first and second sample values with one another to establish a sensor discrepancy when the first and second samples differ from one another by more than a secondary threshold, lower than the primary threshold, for a predetermined second number of samples.

Additionally programming the comparator module in such a manner provides a sensor failure detector which is able to annunciate an early warning of possible sensor degradation that is indicative of likely future failure, and thus allows the opportunity to pre-emptively service or replace one or both of the first and second sensors.

In a preferred embodiment of the invention the comparator module is additionally programmed, when it has established a sensor discrepancy, to output to downstream processes qualified measurement values corresponding to the same first or second sample values being utilised before establishment of the sensor discrepancy.

Such additional programming of the comparator module is beneficial because it provides an early indication of a likely future failure but without causing a loss of redundancy within the sensor failure detector, i.e. the detector is still able to switch to using sample values from a sensor that remains operational in the event that one sensor fails, even after establishment of a sensor.

Preferably the predetermined second number of samples is greater than the predetermined first number of samples.

Utilising a greater second number of samples means that establishing a sensor discrepancy has a reduced sensitivity to transient variations in the first and second sample values, which helps to avoid inadvertent and erroneous establishment of a sensor discrepancy.

The comparator module may include first and second comparator sub-modules arranged in operative communication with the first and second inputs to permit a sample-by-sample determination of whether the difference between sample values exceeds a corresponding threshold and establishment of a corresponding sensor failure or sensor discrepancy if the corresponding threshold is exceeded for the corresponding predetermined number of samples.

One of the comparator sub-modules may be configured to consider whether the first and second sample values differ from one another by more than the primary threshold for the predetermined first number of samples, and the other of the comparator sub-modules may be configured to consider whether the first and second sample values differ from one another by more than the secondary threshold for the predetermined second number of samples.

The foregoing features establish dedicated consideration of whether the primary and secondary thresholds are exceeded, by separate sub-modules, and so help to ensure quick and efficient processing of such considerations.

Preferably the comparator module includes a switching sub-module to selectively switch, when a sensor failure has been established, between first and second sample values from the sensor remaining operational.

The inclusion of such a switching sub-module provides a reliable and repeatable way of outputting to downstream processes reliable, i.e. qualified, measurement values corresponding to the sensor remaining operational.

Optionally the comparator module includes a synchronisation sub-module arranged in operative communication with the first and second inputs to receive in-use first and second sample values, the synchronisation sub-module synchronising corresponding received sample values with one another, calculating a difference between said synchronised first and second sample values, and providing the said calculated difference to each of the first and second comparator sub-modules.

Such a synchronisation sub-module helps to ensure the correct pairing up of respective first and second sample values that result from a measurement taken by each of first and second sensors at the same instant of time.

Such a synchronisation sub-module also helps distribute the processing required within the comparator module by calculating the difference between each of the said synchronised first and second sample values before passing that calculation to the first and second comparator sub-modules.

Optionally at least one of the first and second inputs is or includes a merging unit to interface with the corresponding sensor and generate a corresponding stream of sample values.

In another preferred embodiment of the invention at least one of the first and second inputs is coupled with a filtering module to process the corresponding received sample values and output corresponding filtered measurement values for use by downstream processes.

Having a comparator module configured in the or each of the aforementioned manners provides the required functionality in a readily deployable manner.

According to a second aspect of the invention there is provided a sensor assembly comprising first and second sensors operatively coupled with a sensor failure detector according to any preceding claim.

The sensor assembly of the invention shares the advantages of the corresponding features of the sensor failure detector of the invention.

According to a third aspect of the invention there is provided a method of establishing a sensor failure within a HVDC power transmission network comprising the steps of:
providing an intelligent electronic device having a first input to receive in-use a plurality of first sample values from a first sensor measuring a given operational characteristic and second input to receive in-use a plurality of second sample values from a second sensor measuring the same given operational characteristic;
comparing the first and second sample values with one another; and establishing a sensor failure when the first and second samples differ from one another by more than a primary threshold for a predetermined first number of samples.

The method of establishing a sensor failure of the invention shares the advantages of the corresponding features of the sensor failure detector of the invention.

It will be appreciated that the use of the terms "first" and "second", and the like, in this patent specification is merely intended to help distinguish between similar features, and is not intended to indicate the relative importance of one feature over another feature, unless otherwise specified.

Within the scope of this application it is expressly intended that the various aspects, embodiments, examples and alternatives set out in the preceding paragraphs, and the claims and/or the following description and drawings, and in particular the individual features thereof, may be taken independently or in any combination. That is, all embodiments and all features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF THE DRAWING

There now follows a brief description of preferred embodiments of the invention, by way of non-limiting example, with reference to the accompanying drawings in which:

FIG. 1 shows a schematic view of a sensor failure detector according to a first embodiment of the invention.

DETAILED DESCRIPTION

A sensor failure detector according to a first embodiment of the invention is designated generally by reference numeral 10, as shown in FIG. 1.

The sensor failure detector 10 is intended primarily for use in HVDC power transmission networks, but it will be appreciated that the invention is applicable mutatis mutandis to other applications operating at different voltage levels.

The sensor failure detector 10 includes an intelligent electronic device 12, e.g. an integrated microprocessor-based controller of power system equipment, which has a first input 14 that, in use, receives a plurality of first sample values 16 from a first sensor 18. Additionally, the intelligent electronic device 12 includes a second input 20 which, in use, receives a plurality of second sample values 22 from a second sensor 24.

Other embodiments of the invention may include both the sensor failure detector and each of the first and second sensors so as to define a sensor assembly.

Returning to the embodiment shown, the first and second sensors 18, 24 may be current or voltage sensors, but are the same type of sensor, i.e. both are current sensors or both are voltage sensors. The first and second sensors 18, 24 are also arranged to, in-use, measure the same operational characteristic 50, e.g. the same current signal or the same voltage signal at the same instant in time and at essentially the same location within an associated power transmission network. It follows that each of the first and second sample values 16, 22 are sampled measurement values.

In addition, in the embodiment shown, the first input 14 includes a first merging unit 26 to interface with the first sensor 18 and generate the corresponding stream of first sample values 16, and the second input 20 includes a second merging unit 28 to interface with the second sensor 24 and generate the corresponding stream of second sample values 22. Other embodiments of the invention need not include such merging units, however.

Meanwhile, the intelligent electronic device 12 also has a comparator module 30 that is programmed to compare the first and second sample values 16, 22 with one another and to establish a sensor failure when the first and second sample values 16, 22 differ from one another by more than a primary threshold for a predetermined first number of samples.

The primary threshold preferably is 0.1 pu, i.e. a variation of about 10%, and the predetermined first number of samples preferably is three, although other primary thresholds and first numbers of samples may be used.

In the embodiment shown, although this need not necessarily be the case, the comparator module 30 is additionally programmed, when comparing the first and second sample values 16, 22 with one another, to establish a sensor discrepancy when the first and second samples differ from one another by more than a secondary threshold for a predetermined second number of samples.

The secondary threshold is lower than the primary threshold and preferably is 0.02 pu, i.e. a variation of about 2%. Similarly the predetermined second number of samples is greater than the predetermined first number of samples, and preferably is ten, although other secondary thresholds and second numbers of samples may similarly be adopted.

More particularly, to facilitate such programming of the comparator module 30, it includes first and second comparator sub-modules 32, 34 that are arranged in operative communication with the first and second inputs 14, 20, and thereby permit a sample-by-sample determination of whether the difference between sample values 16, 22 exceeds the one or other of the primary threshold or the secondary threshold.

More particularly still, the first comparator sub-module 32 is configured to consider whether the first and second sample values differ from one another by more than the primary threshold for the predetermined first number of samples, and the second comparator sub-module 34 is configured to consider whether the first and second sample values differ from one another by more than the secondary threshold for the predetermined second number of samples. In other embodiments of the invention (not shown) this may differ, e.g. with the second comparator sub-module 34 instead being configured to consider whether the first and second sample values differ from one another by more than the primary threshold for the predetermined first number of samples, and the first comparator sub-module 32 instead being configured to consider whether the first and second sample values differ from one another by more than the secondary threshold for the predetermined second number of samples.

To facilitate such comparisons by the first and second comparator sub-modules 32, 34, the comparator module 30 in the embodiment shown also includes a synchronisation sub-module 52 that is arranged in operative communication with the first and second inputs 14, 20 to receive, in-use, the first and second sample values 16, 22.

The synchronisation sub-module 52 synchronises corresponding received sample values 16, 22 with one another, i.e. pairs up respective first and second sample values 16, 22 that result from a measurement taken by each of first and second sensors 18, 24 at the same instant of time, The synchronisation sub-module 52 additionally calculates a difference between said synchronised first and second sample values 16, 22, and then provides that calculated difference to each of the first and second comparator sub-modules 32, 34.

The first comparator sub-module 32 is then able to consider whether the calculated difference between the first and second sample values is more than the primary threshold for the predetermined first number of samples, and thereafter able to establish a sensor failure if the primary threshold, e.g. 0.1 pu, is exceeded for the predetermined first number of samples, e.g. three.

Similarly, the second comparator sub-module 34 is able to consider whether the calculated difference between the first and second sample values is more than the secondary threshold for the predetermined second number of samples, and thereafter establish a sensor discrepancy if the secondary threshold, e.g. 0.02 pu, is exceeded for the predetermined second number of samples, e.g. ten.

In addition to the foregoing, the first input 14 is coupled with a first filtering module 38 to process the received first sample values 16 and output first filtered measurement values 40 for use by downstream processes, and in particular for use by the determination module 36. Similarly, the second input 20 is coupled with a second filtering module 42 to process the received second sample values 22 and output second filtered measurement values 44, again for use by the determination module 36. Each of the filtering modules 38, 42 preferably includes anti-aliasing and down-sampling elements.

The comparator module 30 is still further additionally programmed, when it has established a sensor failure (i.e. when the first comparator sub-module 32 indicates that the primary threshold has been exceeded for the predetermined first number of samples), to identify the sensor that remains operational as being the first or second sensor 18, 24 with sample values 16, 22 that are furthest from zero, i.e. with sample values 16, 22 with the greatest magnitude. The comparator module 30 is then able to flag the other sensor as failed.

The comparator module 30 in the embodiment shown is also programmed, when it has established a sensor failure, i.e. when the first comparator sub-module 32 indicates that the primary threshold has been exceeded for the predetermined first number of samples), to output to downstream processes such as control or protection equipment (not shown) qualified measurement values 46 that correspond to the first or second sample values 16, 22 from the sensor remaining operational.

Optionally, upon the establishment of a sensor failure, i.e. following an indication of such by the first comparator sub-module 32, the comparator module 30 issues a sensor failure alarm 54, e.g. to a human operator relying on the output qualified measurement values 46.

In other words, in the event of a sensor failure being established, the comparator module 30 maintains (or switches) its output to qualified measurement values 46 that come from whichever of the first or second sensors 18, 24 has not failed, i.e. outputs qualified measurement values 46 that correspond to whichever of the first or second filtered measurement values 40, 44, as output from the respective first or second filtering module 38, 42, are being provided by the still healthy first or second sensor 18, 24, i.e. by whichever of the first or second sensors 18, 24 remains operational.

One way of achieving such selective switching of qualified measurement values 46 is by the inclusion in the comparator module 30 of a switching sub-module 36 to selectively switch, when a sensor failure has been established, between first and second sample values 16, 22, i.e. between first and second filtered measurement values 40, 44, from the sensor 18, 24 remaining operational.

Additionally the comparator module 30 is also programmed, when it has established a sensor discrepancy (i.e. when the second comparator sub-module 34 indicates that the secondary threshold has been exceeded for the predetermined second number of samples), to continue outputting (via the switching module 36) to downstream processes qualified measurement values 46 corresponding to the same first or second sample values 16, 22, i.e. the same first or second filtered measurement values 40, 44, that were being utilised before establishment of the sensor discrepancy.

In other words, in the event of a sensor discrepancy being established the switching module 36 does nothing to switch or otherwise alter the input feed that gives rise to the qualified measurement values 46 it provides to other downstream processes.

The comparator module 30 may, upon the establishment of a sensor discrepancy, issue a sensor discrepancy alarm 56, e.g. to a human operator.

The comparator module 30 also, may be capable of being switched on and off, e.g. by way of an enable switch 48, so as to selectively activate or disable sensor failure detection by the sensor failure detector 10.

We claim:

1. A sensor failure detector, for use in HVDC power transmission networks, comprising an intelligent electronic device having:
    a first input to receive in-use a plurality of first sample values from a first sensor measuring a given operational characteristic;
    a second input to receive in-use a plurality of second sample values from a second sensor measuring the same given operational characteristic; and
    a comparator module programmed to compare the first and second sample values with one another and to establish a sensor failure when the first and second sample values differ from one another by more than a primary threshold for a predetermined first number of samples greater than one.

2. A sensor failure detector according to claim 1, wherein the comparator module is additionally programmed, when it has established a sensor failure, to identify the sensor remaining operational as being the first or second sensor with sample values that are furthest from zero.

3. A sensor failure detector according to claim 1, wherein the comparator module is further programmed, when it has established a sensor failure, to output to downstream processes qualified measurement values corresponding to the first or second sample values from the sensor remaining operational.

4. A sensor failure detector according to claim 1, wherein the comparator module is additionally programmed when comparing the first and second sample values with one another to establish a sensor discrepancy when the first and second samples differ from one another by more than a secondary threshold, lower than the primary threshold, for a predetermined second number of samples greater than one.

5. A sensor failure detector according to claim 4, wherein the comparator module is additionally programmed, when it has established a sensor discrepancy, to output to downstream processes qualified measurement values corresponding to the same first or second sample values being utilised before establishment of the sensor discrepancy.

6. A sensor failure detector according to claim 4, wherein the predetermined second number of samples is greater than the predetermined first number of samples.

7. A sensor failure detector according to claim 4, wherein the comparator module includes first and second comparator sub-modules arranged in operative communication with the first and second inputs to permit a sample-by-sample determination of whether the difference between sample values exceeds a corresponding threshold and establishment of a corresponding sensor failure or sensor discrepancy if the corresponding threshold is exceeded for the corresponding predetermined number of samples.

8. A sensor failure detector according to claim 7, wherein one of the comparator sub-modules is configured to consider whether the first and second sample values differ from one another by more than the primary threshold for the predetermined first number of samples, and the other of the comparator sub-modules is configured to consider whether the first and second sample values differ from one another by more than the secondary threshold for the predetermined second number of samples.

9. A sensor failure detector according to claim 7, wherein the comparator module includes a switching sub-module to selectively switch, when a sensor failure has been established, between first and second sample values from the sensor remaining operational.

10. A sensor failure detector according to claim 7, wherein the comparator module includes a synchronisation sub-module arranged in operative communication with the first and second inputs to receive in-use first and second sample values, the synchronisation sub-module synchronising corresponding received sample values with one another, calculating a difference between said synchronised first and second sample values, and providing the said calculated difference to each of the first and second comparator sub-modules.

11. A sensor failure detector according to claim 1, wherein at least one of the first and second inputs is or includes a merging unit to interface with the corresponding sensor and generate a corresponding stream of sample values.

12. A sensor failure detector according to claim 1, wherein at least one of the first and second inputs is coupled with a filtering module to process the corresponding received sample values and output corresponding filtered measurement values for use by downstream processes.

13. A sensor assembly comprising first and second sensors operatively coupled with a sensor failure detector according to claim 1.

14. A method of establishing a sensor failure within a HVDC power transmission network, comprising the steps of:
    providing an intelligent electronic device having a first input to receive in-use a plurality of first sample values from a first sensor measuring a given operational characteristic and second input to receive in-use a plurality of second sample values from a second sensor measuring the same given operational characteristic;
    comparing the first and second sample values with one another; and
    establishing a sensor failure when the first and second samples differ from one another by more than a primary threshold for a predetermined first number of samples greater than one.

15. The method of claim 14, further comprising:
    identifying the sensor remaining operational as being the first or second sensor with sample values that are furthest from zero.

16. The method of claim 14, further comprising:
   establishing a sensor discrepancy when the first and second samples differ from one another by more than a secondary threshold, lower than the primary threshold, for a predetermined second number of samples greater than one.

17. The method of claim 14, wherein at least one of the first and second inputs is or includes a merging unit to interface with the corresponding sensor and generate a corresponding stream of sample values.

18. The method of claim 14, wherein at least one of the first and second inputs is coupled with a filtering module to process the corresponding received sample values and output corresponding filtered measurement values for use by downstream processes.

19. The method of claim 14, further comprising:
   outputting to downstream processes qualified measurement values corresponding to the first or second sample values from the sensor remaining operational.

20. The method of claim 14, further comprising:
   selectively switching, when a sensor failure has been established, between first and second sample values from the sensor remaining operational.

* * * * *